(12) United States Patent
Yin et al.

(10) Patent No.: US 11,791,348 B1
(45) Date of Patent: Oct. 17, 2023

(54) TRANSISTOR, GATE DRIVE CIRCUIT AND DISPLAY DEVICE

(71) Applicant: HKC CORPORATION LIMITED, Shenzhen (CN)

(72) Inventors: Dujuan Yin, Shenzhen (CN); Haoxuan Zheng, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/145,242

(22) Filed: Dec. 22, 2022

(30) Foreign Application Priority Data

Jun. 30, 2022 (CN) .......................... 202210763131.X

(51) Int. Cl.
| | |
|---|---|
| *G09G 3/3266* | (2016.01) |
| *H01L 27/12* | (2006.01) |
| *H01L 23/552* | (2006.01) |
| *H01L 29/786* | (2006.01) |
| *G09G 3/20* | (2006.01) |
| *G11C 27/04* | (2006.01) |

(52) U.S. Cl.
CPC ............ *H01L 27/124* (2013.01); *G09G 3/20* (2013.01); *G09G 3/3266* (2013.01); *G11C 27/04* (2013.01); *H01L 23/552* (2013.01); *H01L 27/1225* (2013.01); *H01L 29/7869* (2013.01); *G09G 2310/0267* (2013.01); *G09G 2310/0286* (2013.01); *G09G 2320/0252* (2013.01); *G09G 2320/041* (2013.01)

(58) Field of Classification Search
CPC . H01L 27/124; H01L 23/552; H01L 27/1225; H01L 29/7869; G09G 3/20; G09G 3/3266; G09G 2310/0267; G09G 2310/0286; G09G 2320/0252; G09G 2320/041; G11C 27/04
See application file for complete search history.

(56) References Cited

U.S. PATENT DOCUMENTS

| | | | |
|---|---|---|---|
| 2023/0097393 A1* | 3/2023 | Cho ................... | H03K 19/0948 257/43 |
| 2023/0252951 A1* | 8/2023 | Hara ..................... | H01L 27/124 345/87 |

* cited by examiner

*Primary Examiner* — Premal R Patel
(74) *Attorney, Agent, or Firm* — Hodgson Russ LLP

(57) ABSTRACT

The transistor comprises a first insulation layer and at least one switch region; a first function layer and a second function layer are respectively disposed on each side of the first insulation layer in the x direction; a first source is disposed in a source region of the first semiconductor layer, and a first drain is disposed at a drain region of the first semiconductor layer; a second source is disposed in a source region of the second semiconductor layer, and is connected to the first source by a first connection line; a second drain is disposed in a source region of the second semiconductor layer, and is connected to the first drain by a second connection line; the gate structure is insulated from the first semiconductor layer and the second semiconductor layer and is disposed opposite to channel regions of the first semiconductor layer and the second semiconductor layer.

20 Claims, 7 Drawing Sheets

TRANSISTOR, GATE DRIVE CIRCUIT AND DISPLAY DEVICE

CROSS-REFERENCE TO RELATED APPLICATIONS

This application is based upon and claims priority to Chinese Patent Application No. 202210763131.X, filed Jun. 30, 2022, the entire disclosure of which is incorporated herein by reference.

TECHNICAL FIELD

The present application relates to the technical field of display drive, and in particular, to a transistor, a gate drive circuit and a display device.

BACKGROUND

In the field of display, a display product is generally provided with a drive circuit, and display control is achieved by turning on or off a thin film transistor (TFT) switch in the drive circuit. Therefore, a large number of TFT switches are distributed in the display panel. Due to the large number of TFT switches, the area occupied by TFT switches is large, and the frame of the display panel becomes wider, resulting in a reduction in the area of the display picture.

The above information disclosed in the Background is only for enhancement of the main function of reducing the understanding of the background of the application, and therefore it may include information that does not form the prior art that is known to a person skilled in the art.

SUMMARY

There are provided a transistor, a gate drive circuit and a display device according to embodiments of the present disclosure. The technical solution is as below:

According to one aspect of the present application, there is provided a transistor comprising a first insulation layer and at least one switch region, wherein the switch region comprises a gate structure, a first function layer and a second function layer; the thickness direction of the first insulation layer is in an x direction, and the first function layer and the second function layer are respectively disposed on each side of the first insulation layer in the x direction;
- the first function layer comprises a first semiconductor layer, a first source disposed in a source region of the first semiconductor layer, and a first drain disposed in a drain region of the first semiconductor layer;
- the second function layer comprises a second semiconductor layer, a second source disposed in a source region of the second semiconductor layer, and a second drain disposed in a drain region of the second semiconductor layer; the second source is connected to the first drain by means of a second connection line passing through the first insulation layer, and the second drain is connected to the first drain by means of a second connection line passing through the first insulation layer.

According to one aspect of the present application, there is further provided a drive circuit. The gate drive circuit comprises a plurality of cascaded shift registers, wherein each shift register comprises a transistor comprising a first insulation layer and at least one switch region, wherein the switch region comprises a gate structure, a first function layer and a second function layer; the thickness direction of the first insulation layer is in an x direction, and the first function layer and the second function layer are respectively disposed on each side of the first insulation layer in the x direction;
- the first function layer comprises a first semiconductor layer, a first source disposed in a source region of the first semiconductor layer, and a first drain disposed in a drain region of the first semiconductor layer;
- the second function layer comprises a second semiconductor layer, a second source disposed in a source region of the second semiconductor layer, and a second drain disposed in a drain region of the second semiconductor layer; the second source is connected to the first drain by means of a second connection line passing through the first insulation layer, and the second drain is connected to the first drain by means of a second connection line passing through the first insulation layer.

According to one aspect of the present application, there is further provided a display device; the display device comprises a display panel and the gate drive circuit; the display panel comprises a display region and a non-display region; and the gate drive circuit is provided in the non-display region;

The gate drive circuit comprises a plurality of cascaded shift registers, wherein each shift register comprises a transistor comprising a first insulation layer and at least one switch region, wherein the switch region comprises a gate structure, a first function layer and a second function layer; the thickness direction of the first insulation layer is in an x direction, and the first function layer and the second function layer are respectively disposed on each side of the first insulation layer in the x direction;
- the first function layer comprises a first semiconductor layer, a first source disposed in a source region of the first semiconductor layer, and a first drain disposed in a drain region of the first semiconductor layer;
- the second function layer comprises a second semiconductor layer, a second source disposed in a source region of the second semiconductor layer, and a second drain disposed in a drain region of the second semiconductor layer; the second source is connected to the first drain by means of a second connection line passing through the first insulation layer, and the second drain is connected to the first drain by means of a second connection line passing through the first insulation layer.

It should be understood that both the foregoing general description and the following detailed description are exemplary only and are not intended to limit the present application.

BRIEF DESCRIPTION OF THE DRAWINGS

The above and other objects, features and advantages of the present application will become more apparent by describing in detail exemplary embodiments thereof with reference to the accompanying drawings.

DETAILED DESCRIPTION OF THE EMBODIMENTS

Figure 1:
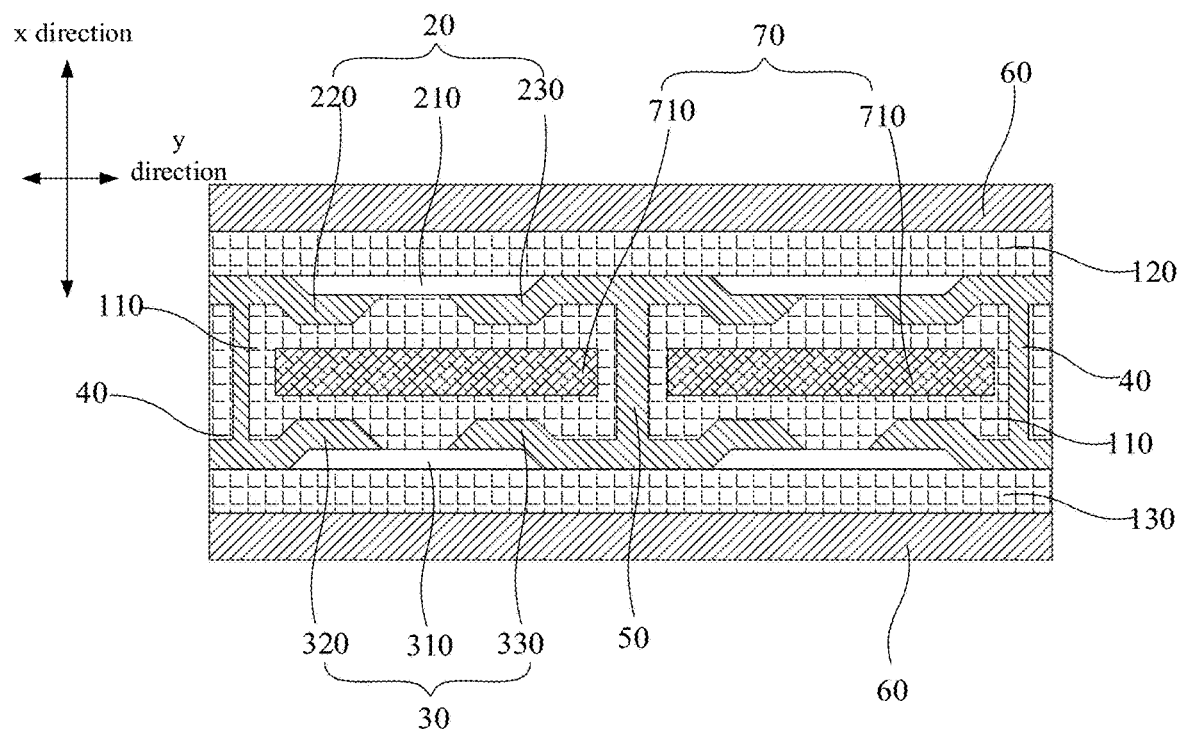
FIG. 1 is a schematic structural diagram of single gate layers in a transistor according to a first embodiment of the present application.

Although the present application may easily be expressed in different forms of embodiments, there are only a few specific embodiments shown in the drawings and described in detail in the present description, and it is understood that the present description should be construed as an exemplary description of the principles of the present application, rather than intended to limit the present application to those described herein.

Hence, one feature referred to in the present description will be used to describe one of the features of an embodiment of the present application, rather than implying that each embodiment of the present application must have the described feature. Furthermore, it should be noted that numerous features are described in the present description. Although certain features may be combined together to show possible system designs, these features may also be used in other combinations not specifically illustrated. Hence, unless otherwise indicated, the combinations illustrated are not intended to limit.

In the embodiments shown in the drawings, directional indications (such as up, down, left, right, front and back) are used to explain that the structure and motion of various elements of the present application are not absolute but relative. These illustrations are suitable when the elements are in the position shown in the figures. If the description of the positions of the elements changes, the indication of the directions also changes accordingly.

Exemplary embodiments will now be described more fully with reference to the accompanying drawings. However, example embodiments may be embodied in many different forms and should not be construed as limited to the examples set forth herein; on the contrary, these exemplary embodiments are provided so that the present application will be thorough and complete, and will fully convey the concept of exemplary embodiments to a person skilled in the art. The drawings are only schematic illustrations of the present application, and are not necessarily drawn to scale. The same reference numerals in the drawings denote the same or similar parts, and thus their repeated descriptions will be omitted.

Preferable embodiments of the present description will be further illustrated below with reference to the accompanying drawings of the present application.

First Embodiment

Figure 2:
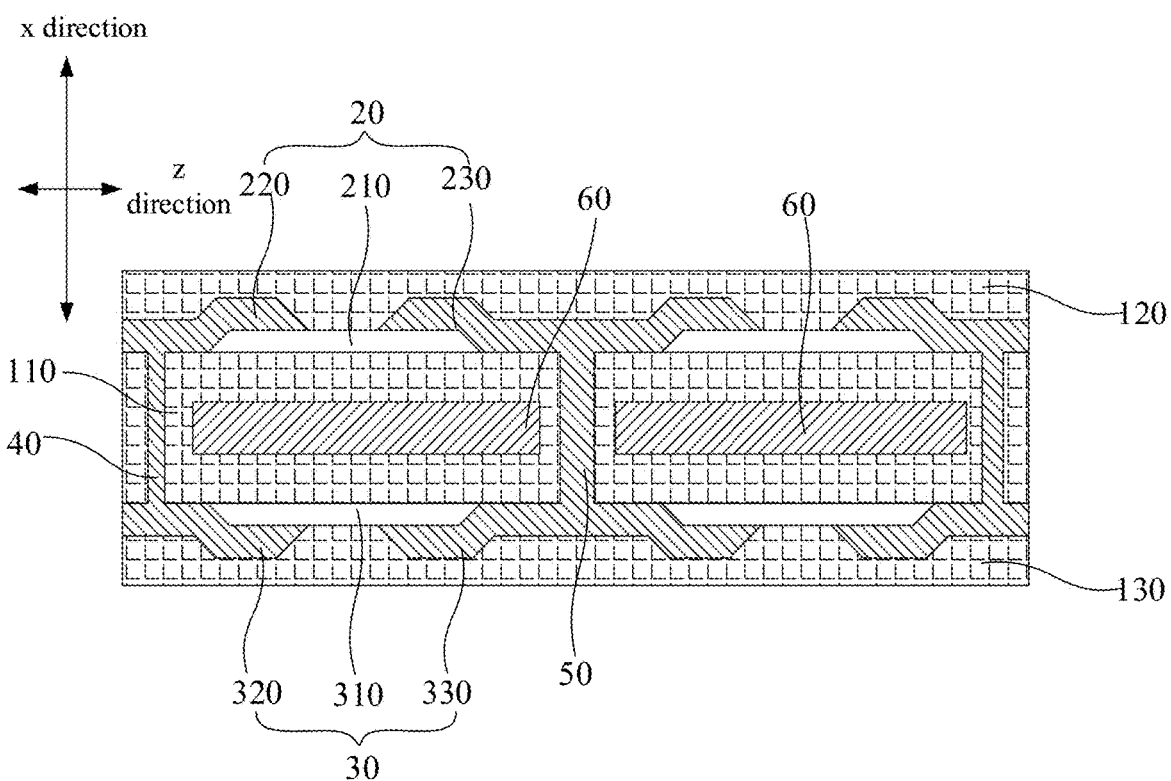
FIG. 2 is a schematic structural diagram of double gate layers in a transistor according to a first embodiment of the present application.

Referring to FIGS. 1 and 2, the present application provides a transistor, and the transistor in the present embodiment refers to a TFT switch transistor. The TFT transistor has advantages of high responsivity, high luminance, and high contrast. In the present embodiment, the first function layer 20 and the second function layer 30 are stacked in the thickness direction of the display panel so as to reduce the distribution in the same plane, thereby reducing the area.

The transistor of the present embodiment comprises a first insulation layer 110 and at least one switch region 1, the switch region 1 comprises a gate structure, a first function layer 20 and a second function layer 30, and the thickness direction of the first insulation layer 110 is an x direction. The first function layer 20 and the second function layer 30 are respectively disposed on each side of the first insulation layer 110 in the x direction; and the first insulation layer 110 may be understood as a substrate, which is a base for disposing the first function layer 20 and the second function layer 30. The first function layer 20 and the second function layer 30 are attached to the first insulation layer 110. The first insulation layer 110 may reduce the external influence on the current of the first function layer 20 or the second function layer 30, and may also reduce the diffusion of metal ions of the first function layer 20 and the second function layer 30. Generally, the first insulation layer 110 is made from silicon dioxide.

The first function layer 20 comprises a first semiconductor layer 210, a first source 220 and a first drain 230; the first source 220 is disposed in a source region of the first semiconductor layer 210, and the first drain 230 is disposed in a drain region of the first semiconductor layer 210; and the first semiconductor layer 210 may be conducted or disconnected under the action of the corresponding gate. When the first semiconductor layer 210 is conducted, the first source 220 and the first drain 230 are conducted; and when the first semiconductor layer 210 is disconnected, the first source 220 and the first drain 230 are disconnected.

The second function layer 30 comprises a second semiconductor layer 310, a second source 320 and a second drain 330; the second source 320 is disposed in a source region of the second semiconductor layer 310, and the second drain 330 is disposed in a drain region of the second semiconductor layer 310; and the second semiconductor layer 310 may be conducted or disconnected under the action of the corresponding gate. When the second semiconductor layer 310 is conducted, the second source 320 and the second drain 330 are conducted; when the second semiconductor layer 310 is disconnected, the second source 320 and the first drain 230 are disconnected; conduction means that there is an electrical signal passing through, and disconnection means that there is no electrical signal flowing through.

The switch region 1 further comprises a first connection line 40 and a second connection line 50, the second source 320 is connected to the first source 220 by means of a first connection line 40 passing through the first insulation layer 110, and the second drain 330 is connected to the first drain 230 by means of the second connection line 50 passing through the first insulation layer 110.

Specifically, the first connection line 40 and the second connection line 50 pass through the first insulation layer 110; one end of the first connection line 40 is connected to the first source 220, and the other end of the first connection line is connected to the second source 320; one end of the second connection line 50 is connected to the first drain 230, and the other end of the second connection line is connected to the second drain 330. Through-holes may be provided on the first insulation layer 110, one through-hole corresponds to the first source 220 and the second source 320, and the other through-hole corresponds to the first drain 230 and the second drain 330; the first connection line 40 is provided in the through-hole corresponding to the first source 220 and the second source 320; and the second connection line 50 is provided in the through-hole corresponding to the first drain 230 and the second drain 330.

The orthographic projections of the first source 220 and the second source 320 on the first insulation layer 110 overlap; the orthographic projections of the first drain 230 and the second drain 330 on the first insulation layer 110 overlap; and central axes of corresponding through-holes are perpendicular to the first insulation layer 110.

The gate structure is disposed to be insulated from the first semiconductor layer 210 and the second semiconductor layer 310 respectively, and is disposed opposite to channel regions of the first semiconductor layer 210 and the second semiconductor layer 310. The gate structure covers a corresponding channel region so as to form a magnetic field, thereby implementing conduction or disconnection of the switch region 1.

In the technical solution of the present embodiment, a first function layer 20 and a second function layer 30 are respectively disposed on the upper and lower surfaces of the first insulation layer 110 in the case where the electrical characteristics of a transistor are ensured to be unchanged. The overlapping and stacking of the first function layer 20 and the second function layer 30 are achieved, and the two layers of the transistors may be distributed in the case that the transistors in the next layer is originally arranged. In the case where the number of the transistors to be distributed is the same, the area to be distributed is directly reduced to half of the original area. In this way, the area occupied by the gate drive circuit is reduced, the frame of the display panel is narrowed, and the size of the display region is increased, i.e., the size of the display picture is increased.

Figure 3:
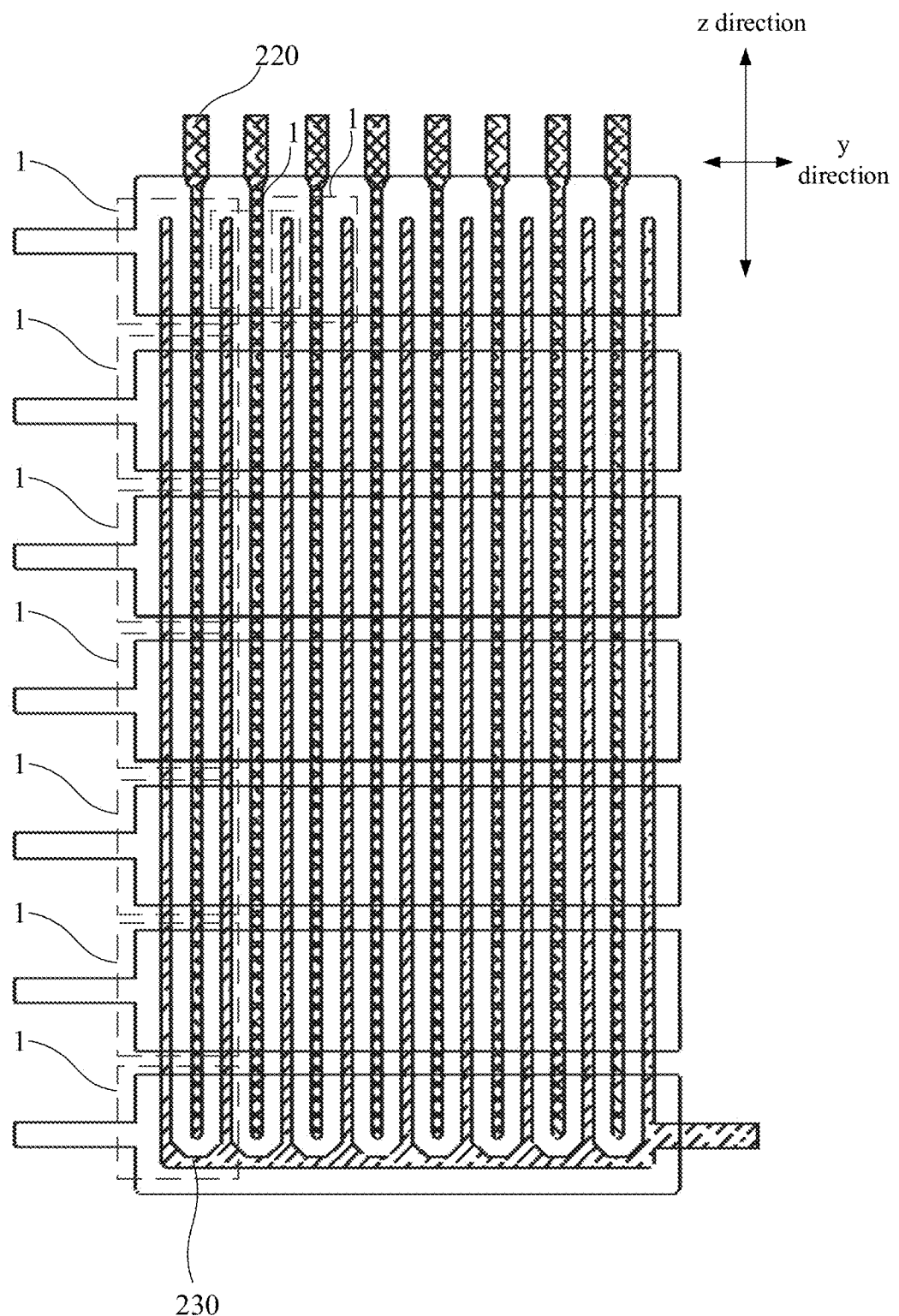
FIG. 3 is a schematic structural diagram of switching regions of a transistor distributed in a y direction according to a first embodiment of the present application.

Referring to FIG. 3, a direction perpendicular to the x direction is defined as a y direction, a plurality of the switch regions 1 are provided, the plurality of the switch regions 1 are distributed in the y direction, and the plurality of the switch regions 1 distributed in the y direction are correspondingly provided with a same gate structure. It may be determined that the gate structure also extends in the y direction, thereby creating an overlap with more switching regions 1. Hence, the plurality of switch regions 1 are controlled to be conducted or disconnected by means of the same gate structure. The structure is simplified, thereby increasing the efficiency of controlling switches.

Figure 4:
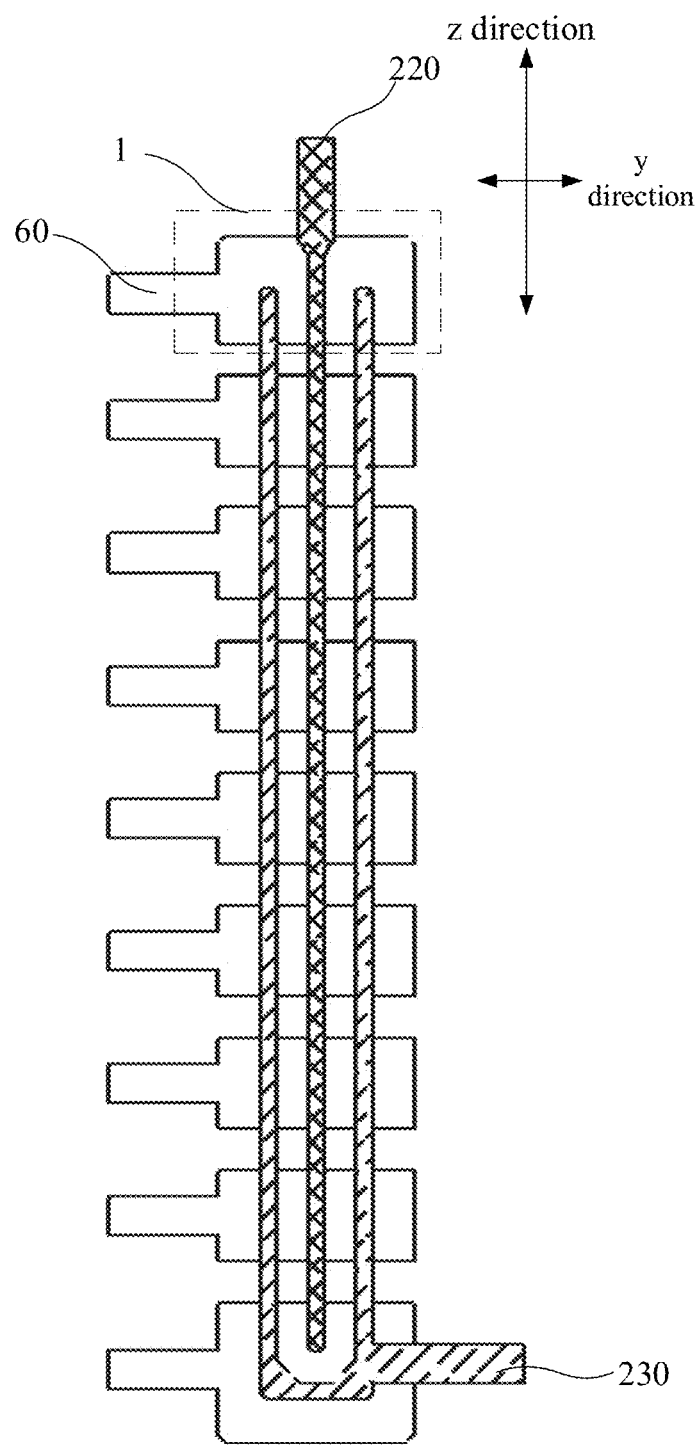
FIG. 4 is a schematic structural diagram of switching regions of a transistor distributed in a z direction according to a first embodiment of the present application.

Referring to FIG. 4, a direction perpendicular to both the x direction and the y direction is defined as a z direction, a plurality of switch regions 1 are distributed in the z direction, a plurality of gate structures are provided and distributed in the z direction, and the switch regions 1 distributed in the z direction are correspondingly provided with the gate structures independently controlled.

In the field of display, a display product is usually confronted with a working environment having a large temperature variation range. In particular, when the temperature in a working environment changes, a voltage threshold of a transistor often drifts. However, the voltage threshold is easily caused by the drift of voltage threshold. In order to adapt the transistor to different temperatures, the electrical characteristics of the transistor are flexibly adjusted. The gate structure is provided with a plurality of gate layers 60, each of the gate layers 60 is arranged corresponding to each of the switch regions 1, and each of the gate layers 60 is arranged corresponding to the other switch region 1.

The width-to-length ratio of the transistor is varied by the number of energization of the gate layers 60 at different temperatures. Generally, the lower the general temperature, the more the gate layers 60 are energized. The gate drive circuit may improve the low-temperature drive capability in a low-temperature environment. Under the condition of high temperature and high humidity, the number of energization of the gate layer 60 is reduced, and then the width-to-length ratio of the transistors is reduced, thereby reducing the heating at high temperature of TFT switches, and alleviating the problems such as display abnormalities caused by the drift of the threshold voltage of TFT switches.

Figure 5:
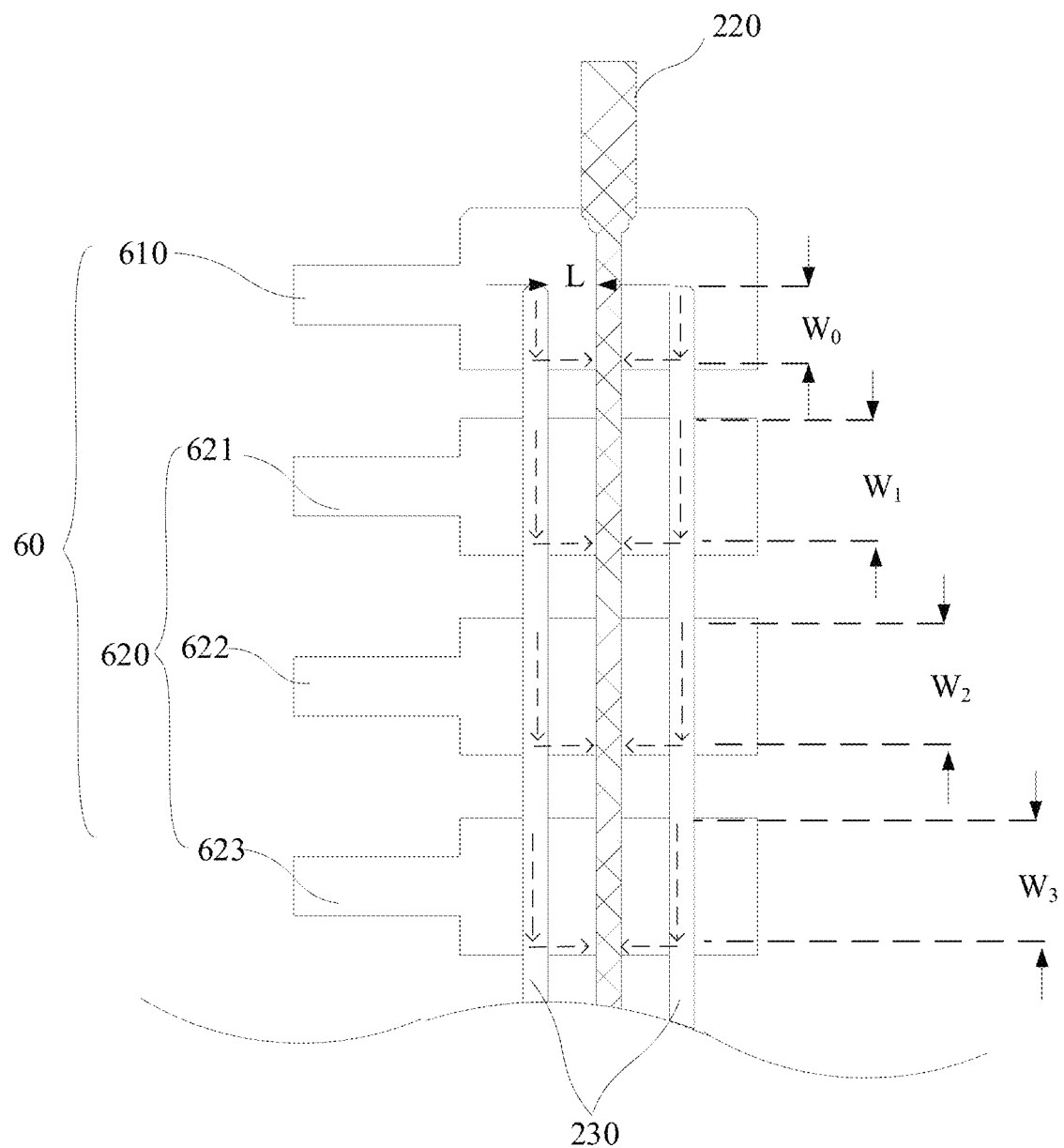
FIG. 5 is a schematic structural diagram of a width-to-length ratio of a transistor in FIG. 4 of the present application.

Specifically, referring to FIG. 5, the gate layer 60 is provided with four control lines, which are respectively a main control line 610 and three compensation control lines 620, and the three compensation control lines 620 are respectively a first compensation line 621, a second compensation line 622, and a third compensation line 623.

An ambient temperature of a transistor is measured, and a compensation signal is generated according to the ambient temperature; when the ambient temperature is a first preset temperature, a first compensation signal is output to the first compensation line 621, a source line and a drain line corresponding to the first compensation line 621 are conducted; and when only the main control line 610 is conducted, a width-to-length ratio of the transistor is $W_0/L$. After the first compensation line 621 is conducted, a width-to-length ratio of the transistor is $W_0/L+W_1/L$.

When the ambient temperature is a second preset temperature, a first compensation signal is output to the first compensation line 621, and a second compensation signal is output to the second compensation line 622; a source line and a drain line corresponding to the first compensation line 621 and a source line and a drain line corresponding to the second compensation line 622 are both conducted; and the width-to-length ratio of the transistor is increased. At this time, the width-to-length ratio of the transistor is $W_0/L+W_1/L+W_2/L$.

When the ambient temperature is a third preset temperature, a first compensation signal is output to the first compensation line 621, a second compensation signal is output to the second compensation line 622, and a third compensation signal is output to the third compensation line 623; a source line and a drain line corresponding to the first compensation line 621, a source line and a drain line corresponding to the second compensation line 622, and a source line and a drain line corresponding to the third compensation line 623 are all conducted, and at this time, the width-to-length ratio of the transistor is $W_0/L+W_1/L+W_2/L+W_3/L$. The first preset temperature is greater than the second preset temperature, and the second preset temperature is greater than the third preset temperature. For example, the first preset temperature is greater than 40° C., the second preset temperature is in the range of 0° C.-40° C., and the third preset temperature is less than 0° C. Hence, the width-to-length ratio of the transistor is continuously increased, thereby improving the low-temperature characteristics.

In order to control switches of a transistor more flexibly, the transistor further comprises two gate layers 60, one of the gate layers 60 is disposed on the side of the first semiconductor layer 210 away from the first insulation layer 110, the first semiconductor layer 210 is disposed on the side of the first source 220 and the first drain 230 away from the first insulation layer 110, and the other of the gate layers 60 is disposed on the side of the second semiconductor layer 310 away from the first insulation layer 110, and the second semiconductor layer 310 is disposed on the side of the second source 320 and the second drain 330 away from the first insulation layer 110. In addition, a second insulation layer 120 is further provided between the gate layer 60 and the first semiconductor layer 210. A third insulation layer 130 is also provided between the other gate layer 60 and the second semiconductor layer 310. The first insulation layer 110, the second insulation layer 120 and the third insulation layer 130 may be made from the same material.

In this way, the upper gate layer 60 may achieve the controlling of the first function layer 20, and after the upper gate layer 60 is energized, a magnetic field affecting the first semiconductor layer 210 is formed, thereby implementing the conduction between the first source 220 and the first drain 230. Similarly, the lower gate layer 60 may achieve the controlling of the second function layer 30, and after the lower gate layer 60 is energized, a magnetic field affecting the second semiconductor layer 310 is formed, thereby implementing the conduction between the second source 320 and the second drain 330.

The upper and lower gate layers 60 may be disposed to energize only one of them, and may also energize both of them, so that the first function layer 20 and the second function layer 30 may function separately, and may function separately as required, thereby having flexible controlling.

The gate layer 60 is a metal layer which generates a magnetic field when energized. The magnetic field has a certain effective action range, and if the upper gate layer 60 is conducted while the lower gate layer 60 is not conducted, the magnetic field of the upper gate layer 60 may affect the second function layer 30. Hence, conduction between the second source 320 and the second drain 330 easily occurs, and unnecessary connection occurs. In order to reduce the mutual interference between the upper and lower gate layers 60 and to avoid the generation of noise signals, the transistor further comprises a metal shielding layer 70 which is positioned within the first insulation layer 110 and covers the orthographic projection position of the gate layer 60 in the first insulation layer 110. In order to further avoid the influence of the magnetic field, the gate layer 60 covers the orthographic projection position of the first insulation layer. The metal shielding layer 70 is positioned within the first insulation layer 110; generally, the distance from the gate layer 70 to the first semiconductor layer 20 is the same as that from the gate layer to the second semiconductor layer 30. The metal shielding layer 70 may be made from a material such as nickel, gold, silver, aluminum or copper.

Further, a plurality of the switch regions 1 are provided, and the metal shielding layer comprises a plurality of shielding segments, and each of the switch regions 1 is correspondingly provided with each of the shielding segments. Each of the switch regions 1 is correspondingly provided with one gate line. In order to reduce the mutual interference between the upper and lower groups of gate lines, the metal shielding layer 70 comprises a plurality of shielding segments 710, a plurality of first connection lines 40 and a plurality of second connection lines 50 are provided, a switch region 1 is formed between the first connection lines 40 and the second connection lines 50, and a shielding segment 710 is provided between each of the first connection lines and the plurality of second connection lines 50.

In order to better improve the shielding effect, the covering area of the shielding segment 710 is the same as the covering area of each gate line in terms of position and size, and the covering area of the shielding layer may also be larger than the covering area of the gate layer 60.

In order to increase the control efficiency, the gate structure further comprises single gate layers 60, the gate layer 60 is disposed between the first semiconductor layer 210 and the second semiconductor layer 310, the gate layer 60 is disposed within the first insulation layer 110, and the distance from the gate layer 60 to the first semiconductor layer 210 is the same as that from the gate layer to the second semiconductor layer 310. By energizing the single gate layer 60, the first function layer and the second function layer 30 may be simultaneously acted on by a magnetic field. That is to say, the first semiconductor layer 210 are conducted to the first source 220 and the first drain 230 under the action of the single gate layers 60, and the second semiconductor layer 310 are conducted to the second source 320 and the second drain 330 under the action of the single gate layers 60.

In this way, not only the upper and lower TFT switches may be controlled by one gate layer 60, but also the space of the first insulation layer 110 may be fully used, thereby reducing the thickness of the transistor.

Figure 6:
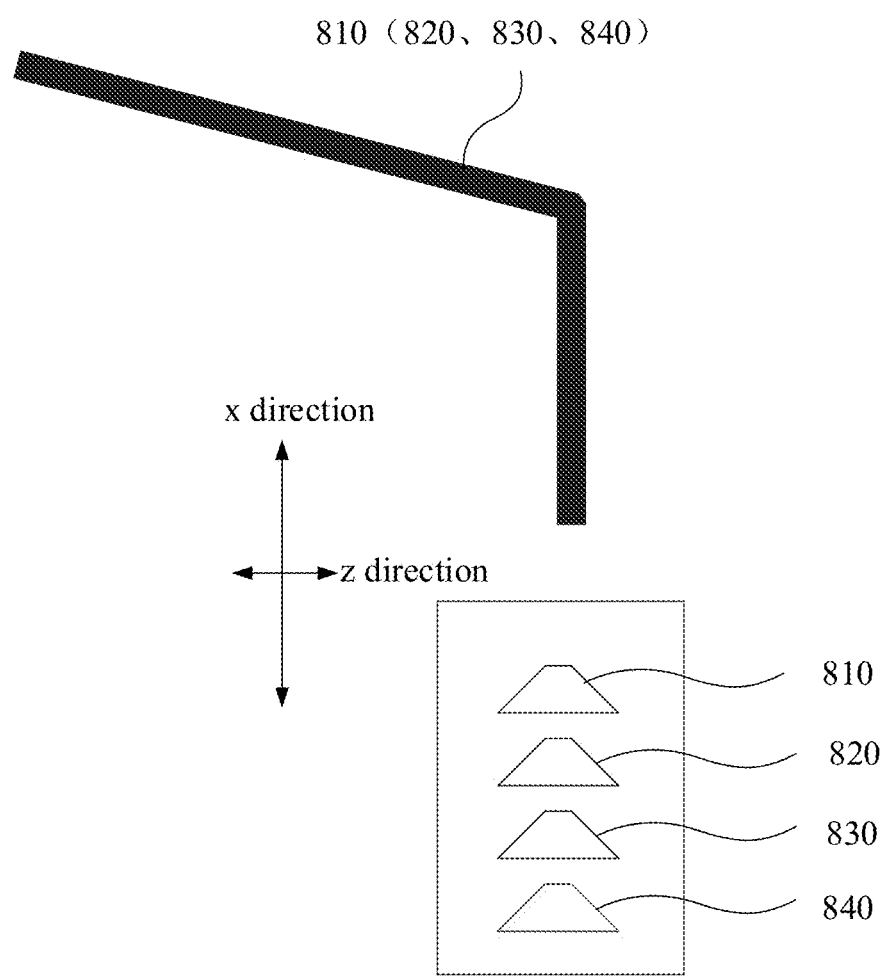
FIG. 6 is a schematic structural diagram of a structure in which a plurality of extension lines overlap in a x direction according to a first embodiment of the present application.

Referring to FIG. 6, the transistor further comprises a first extension line 810 and a second extension line 820; the first extension line 810 and the first source 220 are disposed in a same layer, the second extension line 820 and the second source 320 are disposed in a same layer, the first extension line 810 is connected to the first source 220, the second extension line 820 is connected to the second source 320, and the orthographic projections of the first extension line 810 and the second extension line 820 on the first insulation layer 110 are the same. Generally, the source is one end of the signal input, and the source needs to be connected to some voltage sources. The connection between the first extension line 810 and the second extension line 820 facilitates signal transmission of the voltage source. Furthermore, the extension paths of the first extension line 810 and the second extension line 820 are provided to be in the same orthographic projection of the first insulation layer 110, so that the thickness of the transistor may be fully utilized, and the extension lines arranged in the same plane may be reduced, thereby further facilitating achievement of a narrow frame. Further, the transistor further comprises a third extension line 830 and a fourth extension line 840; and the first extension line 810 and the second extension line 820 as well as the third extension line 830 and the fourth extension line 840 are disposed sequentially in the thickness direction of the display panel.

In order to increase the response speed, the first semiconductor layer 210 and the second semiconductor layer 310 are made from indium gallium zinc oxide (IGZO); the IGZO is an amorphous oxide containing indium, gallium and zinc; and the carrier mobility is 20 to 30 times that of amorphous silicon, which may greatly increase the charging and discharging rate of a TFT to a pixel electrode, increase the response speed of a pixel, achieve a faster refresh rate, and also greatly increase the line scanning rate of the pixel with a faster response.

Second Embodiment

Figure 7:
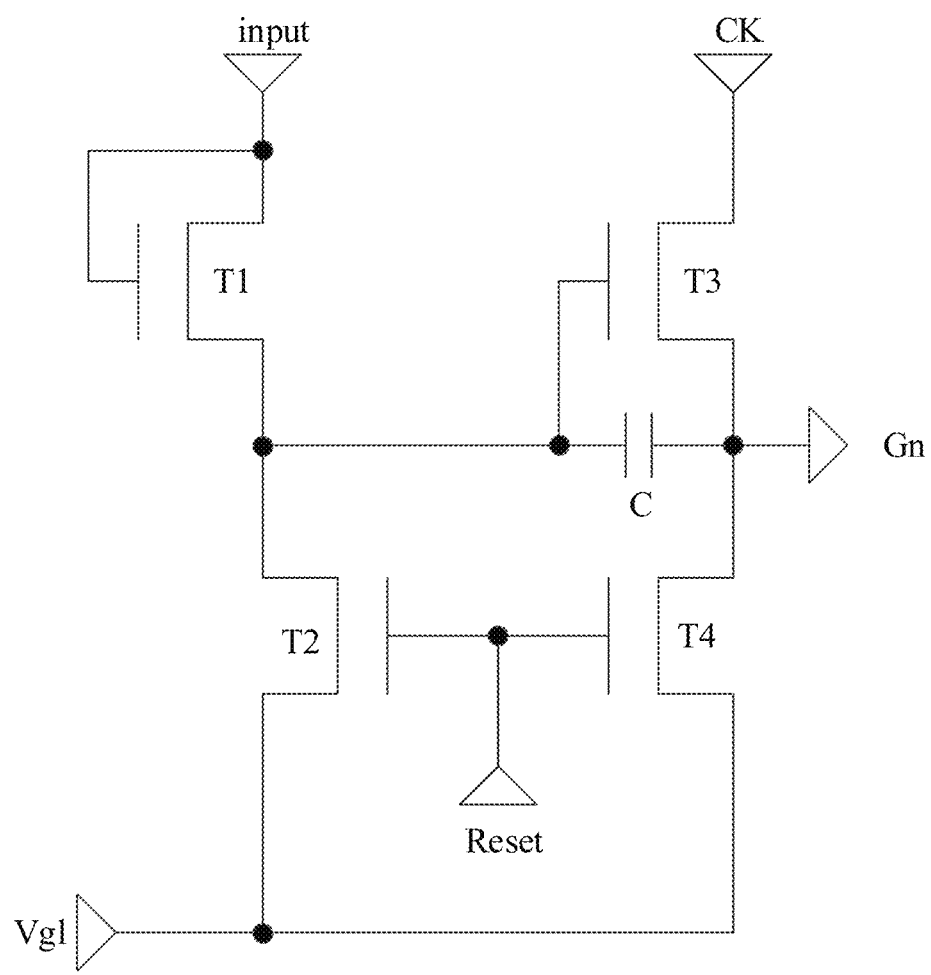
FIG. 7 is a schematic connection diagram of a gate drive circuit according to a second embodiment of the present application.

Referring to FIG. 7, the present application further provides a gate drive circuit. The gate drive circuit comprises a plurality of cascaded shift registers, and each shift register comprises the transistor.

In one gate drive circuit, the width-to-length ratio of the transistors of the first transistor switch T1 and the third transistor switch T3 are relatively large, for example, the width-to-length ratio is greater than 100. The first transistor switch T1 and the third transistor switch T3 are easily affected by temperature, causing the threshold voltage to shift. Through the present embodiment, the first transistor switch T1 and the third transistor switch T3 may be provided with the transistors mentioned above. The first transistor switch T1 and the third transistor switch T3 are replaced by the described transistors having an adjustable width-to-length ratio.

The signal input terminal "Input" input a high level, the first transistor switch T1 is turned on to charge the capacitor C, and the third transistor switch T3 is conducted under the action of the high level. The clock signal CK is loaded on the capacitor C, and a control signal is output through the output terminal Gn. After the control signal is output, the reset terminal "Reset" outputs a high level, the second transistor switch T2 and the fourth transistor switch T4 are turned on, and the reset voltage Vgl is reset at the two terminals of the capacitor C.

The transistor comprises a first insulation layer 110 and at least one switch region 1; the switch region 1 comprises a gate structure, a first function layer 20 and a second function layer 30; and the thickness direction of the first insulation layer is the x direction. The first function layer 20 and the second function layer 30 are respectively disposed on each side of the first insulation layer 110 in the x direction; and the first insulation layer 110 may be understood as a substrate, which is a base for disposing the first function layer 20 and the second function layer 30. The first function layer 20 and the second function layer 30 are attached to the upper first insulation layer 110. The first insulation layer 110 may reduce the external influence on the current of the first function layer 20 or the second function layer 30, and may also reduce the diffusion of metal ions of the first function layer 20 and the second function layer 30. Generally, the first insulation layer 110 is made from silicon dioxide.

The first function layer 20 comprises a first semiconductor layer 210, a first source 220 and a first drain 230; the first source 220 is disposed in a source region of the first semiconductor layer 210, and the first drain 230 is disposed in a drain region of the first semiconductor layer 210; and the first semiconductor layer 210 may be conducted or disconnected under the action of the corresponding gate. When the first semiconductor layer 210 is conducted, the first source 220 and the first drain 230 are conducted; and when the first semiconductor layer 210 is disconnected, the first source 220 and the first drain 230 are disconnected.

The second function layer 30 comprises a second semiconductor layer 310, a second source 320 and a second drain 330; the second source 320 is disposed in a source region of the second semiconductor layer 310, and the second drain 330 is disposed in a drain region of the second semiconductor layer 310; and the second semiconductor layer 310 may be conducted or cut off under the action of the corresponding gate. When the second semiconductor layer 310 is conducted, the second source 320 and the second drain 330 are conducted; and when the second semiconductor layer 310 is disconnected, the second source 320 and the first drain 230 are disconnected.

The switch region 1 further comprises a first connection line 40 and a second connection line 50; the second source is connected to the first source by means of a first connection line passing through the first insulation layer; the second drain is disposed in a drain region of the second semiconductor layer; and the second drain is connected to the first drain by means of a second connection line passing through the first insulation layer.

Specifically, the first connection line 40 and the second connection line 50 pass through the first insulation layer 110; one end of the first connection line 40 is connected to the first source 220, the other end of the first connection line is connected to the second source 320; one end of the second connection line 50 is connected to the first drain 230, and the other end of the second connection line is connected to the second drain 330. Through-holes may be provided on the first insulation layer 110, one through-hole corresponds to the first source 220 and the second source 320, and the other through-hole corresponds to the first drain 230 and the second drain 330; the first connection line 40 is provided in the through-hole corresponding to the first source 220 and the second source 320; and the second connection line 50 is provided in the through-hole corresponding to the first drain 230 and the second drain 330.

The orthographic projections of the first source 220 and the second source 320 on the first insulation layer 110 overlap; the orthographic projections of the first drain 230 and the second drain 330 on the first insulation layer 110 overlap; and central axes of corresponding through-holes are perpendicular to the first insulation layer 110.

The gate structure is disposed to be insulated from the first semiconductor layer 210 and the second semiconductor layer 310 respectively, and is disposed opposite to channel regions of the first semiconductor layer 210 and the second semiconductor layer 310. The gate structure covers a corresponding channel region so as to form a magnetic field, thereby implementing conduction or disconnection of the switch region 1.

In the technical solution of the present embodiment, multiple groups of transistors are stacked up and down, thereby further reducing the area occupied by the gate drive circuit, and reducing the area occupied by the gate drive circuit in the non-display region 920. In addition, individual control of each transistor may be achieved separately by means of the controller.

The embodiments of the gate drive circuit of the present invention comprise all the technical solutions of all the embodiments of the described transistors, and the achieved technical effects are also completely the same, which will not be repeated herein.

Third Embodiment

Figure 8:
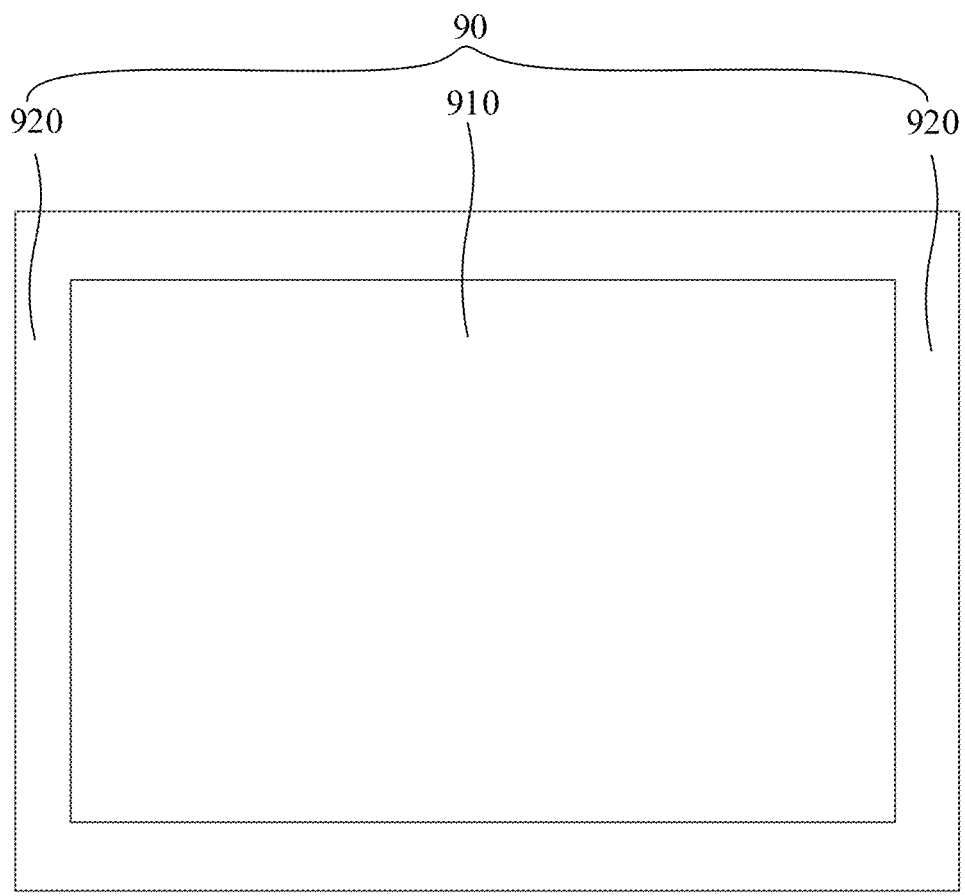
FIG. 8 is a schematic structural diagram of a display device according to a third embodiment of the present invention.

Referring to FIG. 8, the present application further provides a display device. The display device comprises a display panel 90; the display panel 90 comprises a display region 910 and a non-display region 920; and a gate drive circuit is disposed in a non-display region 920. The display region 910 is configured to allow light to pass through the display picture, and the non-display region 920 is generally disposed around the display region 910. Providing the gate drive circuit in the non-display region 920 may avoid blocking light in the display region 910.

The transistor comprises a first insulation layer 110 and at least one switch region 1; the switch region 1 comprises a gate structure, a first function layer 20 and a second function layer 30; and the thickness direction of the first insulation layer is the x direction. The first function layer 20 and the second function layer 30 are respectively disposed on each side of the first insulation layer 110 in the x direction; and the first insulation layer 110 may be understood as a substrate, which is a base for disposing the first function layer 20 and the second function layer 30. The first function layer 20 and the second function layer 30 are attached to the upper first insulation layer 110. The first insulation layer 110 may reduce the external influence on the current of the first function layer 20 or the second function layer 30, and may also reduce the diffusion of metal ions of the first function layer 20 and the second function layer 30. Generally, the first insulation layer 110 is made from silicon dioxide.

The first function layer 20 comprises a first semiconductor layer 210, a first source 220 and a first drain 230; the first source 220 is disposed in a source region of the first semiconductor layer 210, and the first drain 230 is disposed in a drain region of the first semiconductor layer 210; and the first semiconductor layer 210 may be conducted or disconnected under the action of the corresponding gate. When the first semiconductor layer 210 is conducted, the first source 220 and the first drain 230 are conducted; and when the first semiconductor layer 210 is disconnected, the first source 220 and the first drain 230 are disconnected.

The second function layer 30 comprises a second semiconductor layer 310, a second source 320 and a second drain 330; the second source 320 is disposed in a source region of the second semiconductor layer 310, and the second drain 330 is disposed in a drain region of the second semiconductor layer 310; and the second semiconductor layer 310 may be conducted or cut off under the action of the corresponding gate. When the second semiconductor layer 310 is conducted, the second source 320 and the second drain 330 are conducted; and when the second semiconductor layer 310 is disconnected, the second source 320 and the first drain 230 are disconnected.

The switch region 1 further comprises a first connection line 40 and a second connection line 50; the second source is connected to the first source by means of a first connection line passing through the first insulation layer; the second drain is disposed in a drain region of the second semiconductor layer; and the second drain is connected to the first drain by means of a second connection line passing through the first insulation layer.

Specifically, the first connection line 40 and the second connection line 50 pass through the first insulation layer 110; one end of the first connection line 40 is connected to the first source 220, the other end of the first connection line is connected to the second source 320; one end of the second connection line 50 is connected to the first drain 230, and the other end of the second connection line is connected to the second drain 330. Through-holes may be provided on the first insulation layer 110, one through-hole corresponds to the first source 220 and the second source 320, and the other through-hole corresponds to the first drain 230 and the second drain 330; the first connection line 40 is provided in the through-hole corresponding to the first source 220 and the second source 320; and the second connection line 50 is provided in the through-hole corresponding to the first drain 230 and the second drain 330.

The orthographic projections of the first source 220 and the second source 320 on the first insulation layer 110 overlap; the orthographic projections of the first drain 230 and the second drain 330 on the first insulation layer 110 overlap; and central axes of corresponding through-holes are perpendicular to the first insulation layer 110.

The gate structure is disposed to be insulated from the first semiconductor layer and the second semiconductor layer respectively, and is disposed opposite to channel regions of the first semiconductor layer and the second semiconductor layer. The gate structure covers a corresponding channel region so as to form a magnetic field, thereby implementing conduction or disconnection of the switch region 1.

In the technical solution of the present embodiment, the non-display region 920 of the display panel 90 may be stacked up and down, the frame is generally disposed in the non-display region 920, and the area of the non-display region 920 occupied by the gate drive circuit is reduced, so that the frame is narrowed, and the size of the display region 910 is increased.

In the technical solution of the present application, a first function layer and a second function layer are respectively disposed on the upper and lower surfaces of the first insulation layer in the case where the electrical characteristics of a transistor are ensured to be unchanged. The overlapping arrangement of the first function layer and the second function layer is achieved, the thickness space of the display device is fully used, and the two layers of the transistors are distributed in the case where the transistors in the next layer are originally arranged. In the case that the number of the transistors to be distributed is the same, the area to be distributed is directly reduced to half of the original area. In this way, the area occupied by the gate drive circuit is reduced, the frame of the display panel is narrowed, and the size of the display region is increased, i.e., the size of the display picture is increased.

The examples of the display device of the present invention comprise all the technical solutions of all the examples of the described transistors, and the achieved technical effects are also completely the same, which will not be repeated herein.

Although the present application has been described with reference to several exemplary embodiments, it should be understood that the terms used are illustrative and exemplary rather than restrictive. As the present application may be embodied in many forms without departing from the spirit or essential characteristics of the invention, it should be understood that the above embodiments are not limited to any of the foregoing details, but should be interpreted broadly within the spirit and scope defined by the appended claims. Therefore, all changes and modifications falling within the scope of the claims or equivalents thereof should be covered by the appended claims.

The invention claimed is:

1. A transistor comprising:
a first insulation layer and at least one switch region, wherein the switch region comprises a gate structure, a first function layer and a second function layer; a thickness direction of the first insulation layer is in an x direction, and the first function layer and the second function layer are respectively disposed on each side of the first insulation layer in the x direction;
wherein the first function layer comprises a first semiconductor layer, a first source disposed in a source region of the first semiconductor layer, and a first drain disposed in a drain region of the first semiconductor layer;
wherein the second function layer comprises a second semiconductor layer, a second source disposed in a source region of the second semiconductor layer, and a second drain disposed in a drain region of the second semiconductor layer; the second source is connected to the first source by means of a first connection line passing through the first insulation layer, and the second drain is connected to the first drain by means of a second connection line passing through the first insulation layer; and
wherein the gate structure is respectively disposed to be insulated from the first semiconductor layer and the second semiconductor layer, and is disposed opposite to channel regions of the first semiconductor layer and the second semiconductor layer.

2. The transistor of claim 1, wherein a direction perpendicular to the x direction is defined as a y direction, a plurality of the switch regions are provided and are distributed in the y direction, and the plurality of the switch regions distributed in the y direction are correspondingly provided with a same gate structure.

3. The transistor of claim 2, wherein a direction perpendicular to both the x direction and the y direction is defined as a z direction, a plurality of the switch regions are distributed in the z direction, a plurality of the gate structures are provided and are distributed in the z direction, and the switch regions distributed in the z direction are correspondingly provided with the gate structures controlled independently.

4. The transistor of claim 1, wherein the gate structure further comprises two gate layers, one of the gate layers is disposed on the side of the first semiconductor layer away from the first insulation layer, the first semiconductor layer is disposed on the side of the first source and the first drain away from the first insulation layer, another of the gate layers is disposed on the side of the second semiconductor layer away from the first insulation layer, and the second semiconductor layer is disposed on the side of the second source and the second drain away from the first insulation layer.

5. The transistor of claim 4, wherein the transistor further comprises a metal shielding layer which is positioned within the first insulation layer and covers an orthographic projection position of the gate layer in the first insulation layer.

6. The transistor of claim 5, wherein a plurality of the switch regions are provided, and the metal shielding layer comprises a plurality of shielding segments, and each of the switch regions is correspondingly provided with each of the shielding segments.

7. The transistor of claim 1, wherein the gate structure further comprises single gate layers, the gate layer is disposed between the first semiconductor layer and the second semiconductor layer, the gate layer is disposed within the first insulation layer, and a distance from the gate layer to the first semiconductor layer is the same as that from the gate layer to the second semiconductor layer.

8. The transistor of claim 1, wherein the first semiconductor layer and the second semiconductor layer are made from indium gallium zinc oxide.

9. A gate drive circuit comprising:
a plurality of cascaded shift registers, wherein each shift register comprises a transistor comprising a first insulation layer and at least one switch region, wherein the switch region comprises a gate structure, a first function layer and a second function layer; a thickness direction of the first insulation layer is in an x direction, and the first function layer and the second function layer are respectively disposed on each side of the first insulation layer in the x direction;
wherein the first function layer comprises a first semiconductor layer, a first source disposed in a source region of the first semiconductor layer, and a first drain disposed in a drain region of the first semiconductor layer;
wherein the second function layer comprises a second semiconductor layer, a second source disposed in a source region of the second semiconductor layer, and a second drain disposed in a drain region of the second semiconductor layer; the second source is connected to the first source by means of a first connection line passing through the first insulation layer, and the second drain is connected to the first drain by means of a second connection line passing through the first insulation layer; and
wherein the gate structure is respectively disposed to be insulated from the first semiconductor layer and the second semiconductor layer, and is disposed opposite to channel regions of the first semiconductor layer and the second semiconductor layer.

10. The gate drive circuit of claim 9, wherein a direction perpendicular to the x direction is defined as a y direction, a plurality of the switch regions are provided and are distributed in the y direction, and the plurality of the switch regions distributed in the y direction are correspondingly provided with a same gate structure.

11. The gate drive circuit of claim 10, wherein a direction perpendicular to both the x direction and the y direction is defined as a z direction, a plurality of the switch regions are distributed in the z direction, a plurality of the gate structures are provided and are distributed in the z direction, and the switch regions distributed in the z direction are correspondingly provided with the gate structures controlled independently.

12. The gate drive circuit of claim 9, wherein the gate structure further comprises two gate layers, one of the gate layers is disposed on the side of the first semiconductor layer away from the first insulation layer, the first semiconductor layer is disposed on the side of the first source and the first drain away from the first insulation layer, another of the gate layers is disposed on the side of the second semiconductor layer away from the first insulation layer, and the second semiconductor layer is disposed on the side of the second source and the second drain away from the first insulation layer.

13. The gate drive circuit of claim 12 wherein the transistor further comprises a metal shielding layer which is positioned within the first insulation layer and covers the orthographic projection position of the gate layer in the first insulation layer.

14. The gate drive circuit of claim 13, wherein a plurality of the switch regions are provided, and the metal shielding layer comprises a plurality of shielding segments, and each of the switch regions is correspondingly provided with each of the shielding segments.

15. The gate drive circuit of claim 9, wherein the gate structure further comprises single gate layers, the gate layer is disposed between the first semiconductor layer and the second semiconductor layer, the gate layer is disposed within the first insulation layer, and a distance from the gate layer to the first semiconductor layer is the same as that from the gate layer to the second semiconductor layer.

16. The gate drive circuit of claim 9, wherein the first semiconductor layer and the second semiconductor layer are made from indium gallium zinc oxide.

17. A display device comprising:
a display panel and a gate drive circuit wherein the display panel comprises a display region and a non-display region, and the gate drive circuit is disposed in the non-display region; and the gate drive circuit comprises a transistor comprising a first insulation layer and at least one switch region, wherein the switch region comprises a gate structure, a first function layer and a second function layer; the thickness direction of the first insulation layer is in an x direction, and the first function layer and the second function layer are respectively disposed on each side of the first insulation layer in the x direction;
wherein the first function layer comprises a first semiconductor layer, a first source disposed in a source region of the first semiconductor layer, and a first drain disposed in a drain region of the first semiconductor layer;
wherein the second function layer comprises a second semiconductor layer, a second source disposed in a source region of the second semiconductor layer, and a second drain disposed in a drain region of the second semiconductor layer; the second source is connected to the first source by means of a first connection line passing through the first insulation layer, and the second drain is connected to the first drain by means of a second connection line passing through the first insulation layer; and wherein the gate structure is respectively disposed to be insulated from the first semiconductor layer and the second semiconductor layer, and is disposed opposite to channel regions of the first semiconductor layer and the second semiconductor layer.

18. The display device of claim 17 wherein a direction perpendicular to the x direction is defined as a y direction, a plurality of the switch regions are provided and are distributed in the y direction, and the plurality of the switch regions distributed in the y direction are correspondingly provided with a same gate structure.

19. The display device of claim 18, wherein a direction perpendicular to both the x direction and they direction is defined as a z direction, a plurality of the switch regions are distributed in the z direction, a plurality of the gate structures are provided and are distributed in the z direction, and the switch regions distributed in the z direction are correspondingly provided with the gate structures controlled independently.

20. The display device of claim 17, wherein the gate structure further comprises two gate layers, one of the gate layers is disposed on the side of the first semiconductor layer away from the first insulation layer, the first semiconductor layer is disposed on the side of the first source and the first drain away from the first insulation layer, another of the gate layers is disposed on the side of the second semiconductor layer away from the first insulation layer, and the second semiconductor layer is disposed on the side of the second source and the second drain away from the first insulation layer.

* * * * *